United States Patent
Wagreich et al.

[11] Patent Number: 5,982,174
[45] Date of Patent: Nov. 9, 1999

[54] EXTERNAL CAVITY FIBER FABRY-PEROT MAGNETOMETER

[76] Inventors: Richard B. Wagreich, 2800 Quebec Ave., NW., Apartment 1151, Washington, D.C. 20008; Christopher C. Davis, 6400 Grason Ter., Bowie, Md. 20715

[21] Appl. No.: 08/896,294

[22] Filed: Jul. 21, 1997

[51] Int. Cl.⁶ .................... G01R 33/032; G01J 4/00
[52] U.S. Cl. .................. 324/244.1; 250/227.17; 324/96; 356/365
[58] Field of Search .................... 324/96, 244.1; 356/351, 352, 365–368; 359/247, 256–258, 280, 281; 250/227.14, 227.17

[56] References Cited

U.S. PATENT DOCUMENTS

| | | |
|---|---|---|
| H371 | 11/1987 | Bobb . |
| 4,533,829 | 8/1985 | Miceli et al. .................... 324/96 X |
| 4,608,535 | 8/1986 | Tada et al. ...................... 324/244.1 |
| 4,939,447 | 7/1990 | Bohnert et al. ..................... 324/96 |
| 4,956,607 | 9/1990 | Abe et al. ....................... 324/96 X |
| 4,968,881 | 11/1990 | Takahashi et al. ................ 324/96 X |
| 5,041,779 | 8/1991 | Hales .............................. 324/96 |
| 5,087,810 | 2/1992 | Carome .......................... 324/96 X |
| 5,119,024 | 6/1992 | Popovic et al. .................. 324/244.1 |
| 5,280,173 | 1/1994 | Morse et al. .................... 324/96 X |
| 5,450,006 | 9/1995 | Tatam ............................. 324/96 |

FOREIGN PATENT DOCUMENTS

| | | |
|---|---|---|
| 081-412 | 6/1983 | European Pat. Off. . |
| 445-362 | 9/1991 | European Pat. Off. . |
| 80779 | 5/1985 | Japan . |
| 2 166 864 | 5/1986 | United Kingdom . |

OTHER PUBLICATIONS

Ning, Y.N., Wang, Z. P., Palmer, A. W., Grattan, K. T. V., and Jackson, D.A., "Recent progress in optical current sensing techniques," Rev. Sci. Instrum. 56 (5), May 1995, pp. 3097–3111.

Deeter, M. N., Rose, A. H., and Day, G. W. "Faraday–effect magnetic field sensors based on substituted iron garnets," Fiber Optic and Laser Sensors VIII, vol. 1367 (SPIE, 1990), pp. 243–248.

Siegman, A. "Chapter 11: Laser Mirrors an Regenerative Feedback", Lasers, pp. 408–426.

Wagreich, R. B. and Davis, Christopher C. "Magnetic Field Detection Enhancement in an External Cavity Fiber Fabry–Perot Sensor," Journal of Lightwave Technology, vol. 14, No. 10 (Oct. 1996), pp. 2246–2249.

*Primary Examiner*—Gerard Strecker
*Attorney, Agent, or Firm*—Watson Cole Grindle Watson P.L.L.C.

[57] ABSTRACT

A magnetometer uses a material exhibiting the Faraday effect, in which the polarization of light transmitted through the material is changed in response to a magnetic field. When the material is placed in a Fabry-Perot cavity, multiple reflections of the light within the Fabry-Perot cavity increase the change in polarization and thus the sensitivity of the magnetometer. Other effects that alter the polarization of light can be employed instead.

11 Claims, 1 Drawing Sheet

EXTERNAL CAVITY FIBER FABRY-PEROT MAGNETOMETER

REFERENCE TO RELATED APPLICATION

This application claims the benefit of U.S. Provisional Application No. 60/022,305, filed Jul. 23, 1996, whose disclosure is hereby incorporated by reference in its entirety into the present disclosure.

GOVERNMENT RIGHTS

This invention is made under NSA Contract No.: MDA-904-91-C-9320. The United States Government may have rights in the invention.

FIELD OF THE INVENTION

The present invention is directed to a magnetometer or other sensor for detecting a physical quantity that causes a non-reciprocal birefringence effect in a material and more particularly to such a magnetometer or other sensor in which a Fabry-Perot cavity is used to enhance the non-reciprocal birefringence effect.

DESCRIPTION OF PRIOR ART

Optically based magnetic field sensors frequently make use of the Faraday effect in bulk crystals and glasses. The Faraday effect causes the polarization of linearly polarized light to rotate as it travels through a medium if a magnetic field is present parallel to direction of propagation of the light. The magnitude of this rotation is different for different materials and in general is proportional to the strength of the applied magnetic field in the direction parallel to the propagation of the light, the length of propagation of the light through the material, and a characteristic of each material known as its Verdet constant. The change in the material properties due to the magnetic field is called induced circular birefringence. More specifically, when a material having a Verdet constant V is exposed to a magnetic field H, a linearly polarized light beam passing through the material along an optical path l has its polarization azimuth rotated by an amount $$\Phi_F = \int_l VH \cdot dl$$

Of course, either V or H, if constant over l, may be moved out of the integral. In particular, if both V and H are constant over l, the equation set forth above simplifies to $$\Phi_F = VH \cdot l$$

The Faraday effect can be employed in an optically based magnetic field detector. By placing a material exhibiting the effect in a magnetic field, transmitting polarized light to the material, and measuring the change in polarization azimuth, such a detector can determine the strength of the magnetic field in the direction of propagation of the light through the material. Such a magnetic field detector is less expensive, but also less sensitive, than a superconducting quantum interference device (SQUID).

The Faraday effect is a non-reciprocal effect, which means that light passing through a material exhibiting this phenomenon will pick up an angular rotation of polarization which is independent of the direction in which the light is traveling. Because of this non-reciprocity, multiple passes through the sensing element increase the magnitude of the polarization rotation and thereby enhance the sensitivity of the system proportionally. An example of a detector using multiple passes is a current detector described by Y. N. Ning et al in "Recent progress in optical current sensing techniques," *Review of Scientific Instruments* 66 (5), May 1995, pp. 3097–3111. In this detector, a bulk glass exhibiting the Faraday effect has a hole through it to receive a wire carrying a current. The current causes a magnetic field around the wire. Light is introduced into the bulk glass and is reflected several times as it goes around the hole. The rotation of the polarization azimuth of the light is related in the manner described above to the magnetic field in the bulk glass and thus to the current in the wire. The peculiar geometry of the detector of Ning et al limits its usefulness to detection of current flowing through a wire or to a narrow range of very similar uses.

SUMMARY OF THE INVENTION

An object of the invention is to provide a detector for detecting a magnetic or other field with high sensitivity in a variety of settings at a reasonable cost.

To achieve this and other objects, the present invention is directed to an apparatus for detecting a magnitude of a physical condition, the apparatus comprising: a Fabry-Perot cavity; a material that exhibits a non-reciprocal birefringence effect in response to the physical condition, the material being disposed in the Fabry-Perot cavity; light source means for supplying light to the Fabry-Perot cavity so that at least a portion of the light is reflected within the Fabry-Perot cavity and passes through the material a plurality of times; detecting means for receiving the portion of the light from the Fabry-Perot cavity and for outputting a signal in response to the portion of the light; and signal analyzing means for receiving the signal and for determining the magnitude of the physical condition in accordance with the signal.

While the invention is contemplated primarily for use with the Faraday effect, it need not be so limited. In fact, the invention can be applied to enhance any nonreciprocal birefringence effect. For example, the Cotton-Mouton effect can be used to detect magnetic fields, and the Kerr or Pockels effect can be used to detect electric fields.

The invention can be used to detect fields, including highly localized fields, in a variety of applications, including biomedical field measurement and imaging applications. The invention can be used in otherwise difficult environments, such as high-power microwave and RF fields and in MRI machines.

The invention can provide very high frequency response measurements, such as above 1 Ghz. Such responses are much faster than those that are available from other technologies, aside from SQUID's.

The measurement of magnetic fields can be greatly enhanced through the use of the invention described in this disclosure. The S/N improvement using a high finesse Fabry-Perot cavity surrounding the sensing material is limited only by the optical losses in the reflectors and the Faraday material itself. An improvement of this magnitude will help to make optically based sensors even more attractive in their many different applications.

The inventors have set forth related concepts in R. B. Wagreich et al, "Magnetic Field Detection Enhancement in an External Cavity Fiber Fabry-Perot Sensor," *Journal of Lightwave Technology*, Vol. 14, No. 10, October 1996, pp. 2246–9. The disclosure of this article is hereby incorporated by reference in its entirety into the present disclosure.

BRIEF DESCRIPTION OF THE DRAWINGS

The present invention will now be described in detail with reference to the drawings, in which.

DETAILED DESCRIPTION OF THE INVENTION

Figure 1A:
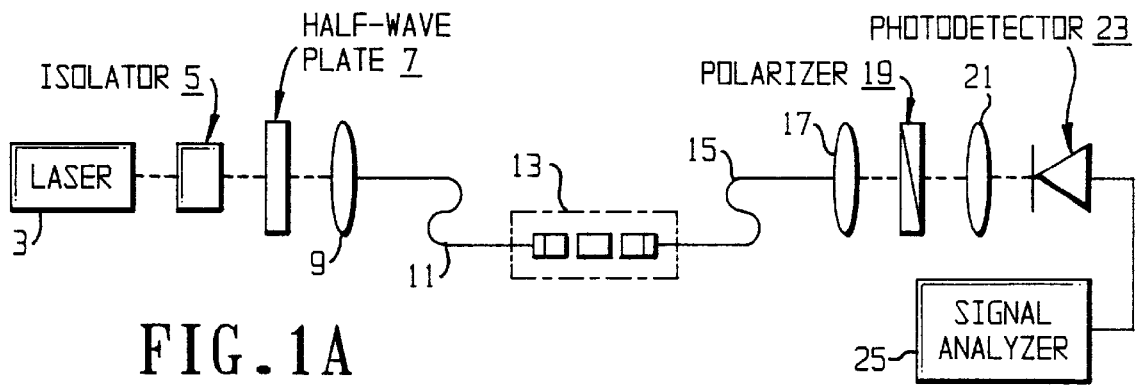
FIG. 1A shows a magnetometer according to the invention.

FIG. 1A shows a magnetometer 1 according to the invention. Linearly polarized light emitted by laser 3 passes through optical isolator 5 to prevent back reflection, then travels through half-wave plate 7 and is then launched by lens 9 into single-mode fiber 11, preferably a polarization maintaining fiber to help eliminate fiber birefringence effects. The optical isolator 5 is needed to prevent laser light from re-entering the laser 3, which causes laser destabilization. The half-wave plate 7 is used to align the polarization direction of the laser light with the best possible path in the fiber 11, called the eigen-axis of the fiber. Fiber 11 carries the light into Fabry-Perot cavity 13, which will be described in detail below, and in which the magnetic field rotates the polarization of the light through the Faraday effect. From Fabry-Perot cavity 13, the light passes through another single-mode optical fiber 15 and is made incident by lens 17 onto analyzing polarizer 19, which extracts the polarization component to be measured. This polarization component is made incident by lens 21 onto photodetector 23, which outputs a signal indicative of the amplitude of the polarization component. Signal analyzer 25 receives the signal and derives the strength of the magnetic field therefrom.

Figure 1B:
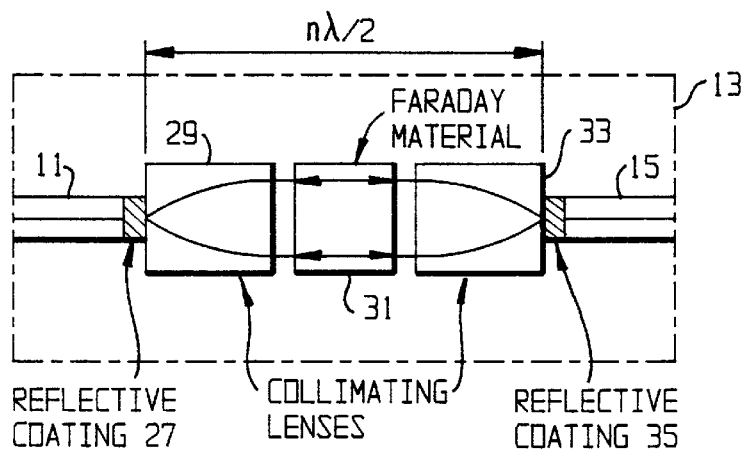
FIG. 1B shows an expanded view of a portion of the magnetometer of FIG. 1A.

The details of Fabry-Perot cavity 13 are shown in FIG. 1B. Single-mode optical fiber 11 has a reflective coating 27 thereon, which is preferably a low-absorption coating. Collimating lens 29 receives light passing through single-mode optical fiber 11 and reflective coating 27 and collimates the light onto Faraday material 31. From Faraday material 31, the light is de-collimated by collimating lens 33 and made incident on reflective coating 35 formed on fiber 15. Coatings 27 and 35 can be essentially similar. Because of reflective coatings 27 and 35, much of the light is reflected back and forth and is thus collimated, sent through the Faraday material, and de-collimated many times, thus intensifying the Faraday effect. By contrast, without the reflective coatings or some other means for causing the desired reflections, light would pass through the Faraday material only once, thus providing a low-sensitivity magnetometer as described above with reference to the prior art.

When the magnetometer is oriented for maximum sensitivity, the signal output by photodetector 23 has a magnitude $I_s$ given by $$I_s I_0 N A_f \sin(\omega_f t)$$

where $I_0$ is the incident light intensity, $A_f$ is a function of the strength of the applied magnetic field in the direction of propagation of the light through the Faraday material, $\omega_f$ is the frequency of the applied magnetic field, and $N$ is the average number of passages that a photon makes through the Faraday material.

N, and thus the sensitivity of magnetometer 1, can be increased by structuring Fabry-Perot cavity 13 as a high-finesse Fabry-Perot cavity. If the ends of fibers 11 and 15 surrounding the Faraday material 31 are coated with a low absorption, highly reflective medium to form reflective coatings 27 and 35, and the reflective coatings 27 and 35 are separated by some integral multiple of one-half wavelength ($n\lambda/2$, where n is an integer) for the laser light being used, both the intensity throughput and the number of passes through the Faraday material 31 are maximized. This distance can be maintained in any of several ways; one possible way is with a simple feedback loop connected to a piezoelectric transducer (PZT) which adjusts the distance between the reflective coatings 27 and 35. If the reflective coatings 27 and 35 and the Faraday material 31 exhibit negligible intensity loss, as is the case for multi-layer dielectric coatings and many common Faraday materials, the throughput intensity for the magnetometer 1 having the Fabry-Perot cavity 13 is virtually identical to that of a magnetometer of the prior art using the single-pass scheme. The signal-to-noise ratio (S/N) is thus greatly enhanced with no loss in signal level due to optical power degradation.

Figure 2:
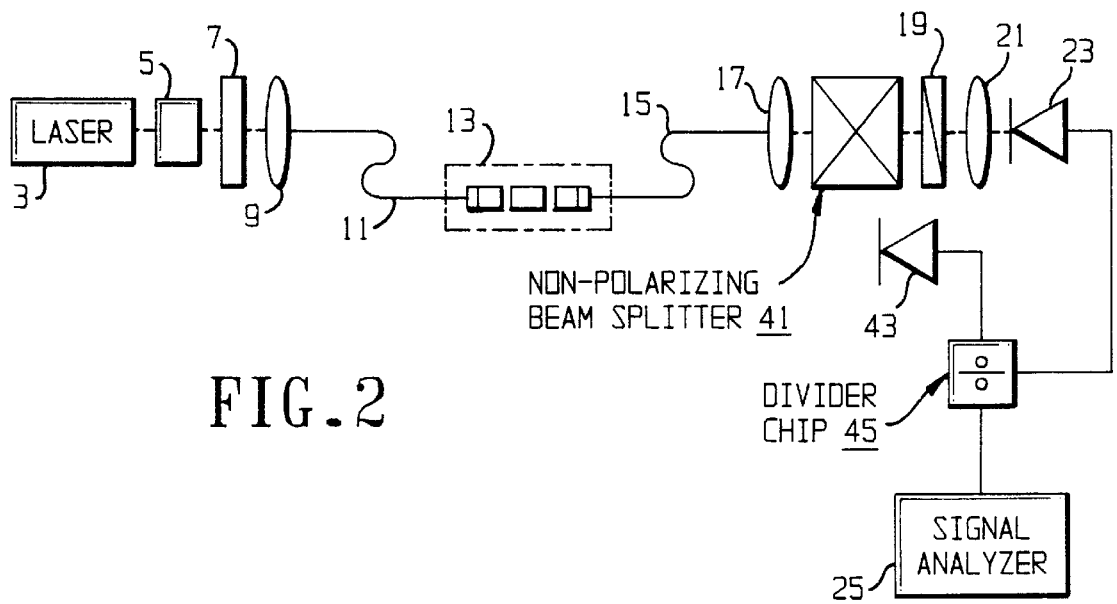
FIG. 2 shows a modification of the magnetometer of FIG. 1A.

Alignment drift and unwanted interference effects can be compensated for by simply picking off a fraction of the output light before the analyzing polarizer. An example of a modified magnetometer 1' that implements this technique is shown in FIG. 2. Magnetometer 1' includes the components shown in FIGS. 1A and 1B for magnetometer 1, including the specifics of Fabry-Perot cavity 13. In addition, magnetometer 1' includes either a non-polarizing beam splitter 41 interposed between lens 17 and analyzing polarizer 19 to pick off a fraction of the output light or an in-fiber coupler disposed to do the same thing. An additional photodetector 43 detects the intensity of the picked off light. By dividing the output signal from photodetector 23 by the signal produced from the picked off off light by photodetector 43 with the use of a simple linear divider chip 45, a normalized signal level can be obtained and supplied to signal analyzer 25.

Several variations of the system can be used with similar sensitivity enhancement effects. Any uncoated fiber ends should be angle-cleaved to prevent any unwanted light reflections which lead to interference effects and can cause signal fading. The laser 3 can be directly connected to a polarization-maintaining fiber for increased coupling efficiency. The reflecting layers 27 and 35 can be made from multi-layer dielectric coatings, as noted above, or from low-loss, highly reflective metallic coatings. Such reflective coatings or other types of reflectors can also be included anywhere within the fibers 11 and 15, as long as the optical path length between them can be controlled. Such control can be accomplished, for example, with a PZT stretcher attached to one of the optical fibers, as an alternative to moving the reflectors themselves. The PZT stretcher controls the optical path length in the fiber by causing stress-induced optical path length changes. Intra-fiber Bragg gratings can also take the place of the reflective coatings. The entire system can be integrated without need for reflector distance adjustment by the inclusion of a liquid crystal (LC) in the optical path with the Faraday material 31. The optical path length of the Fabry-Perot cavity can be adjusted in this configuration with an applied electric field across the LC which changes its birefringence properties. The entire Fabry-Perot cavity configuration can be integrated onto a single v-grooved chip to prevent loss due to misalignment. The analyzing polarizer and the photodetector can be connected by an optical fiber to reduce coupling losses. Any Faraday material can be used, as can any other material exhibiting a nonreciprocal birefringence effect in response to some quantity to be measured. The modifications disclosed in this disclosure, although disclosed separately, can be combined as needed. Therefore, the invention should be construed as limited only by the appended claims.

We claim:

1. An apparatus for detecting a magnitude of a physical condition, the apparatus comprising:

a Fabry-Perot cavity having reflective end surfaces for reflecting light therebetween;

a material that exhibits a non-reciprocal birefringence effect in response to the physical condition, the material being disposed in the Fabry-Perot cavity;

light source means for supplying light to the Fabry-Perot cavity, said end surfaces being separated by about an integer number of one-half wavelengths of the light so that at least a portion of the light reflected between the reflective end surfaces within the Fabry-Perot cavity passes through the material a plurality of times maximized by the separation of the end surfaces;

detecting means for receiving the portion of the light from the Fabry-Perot cavity and for outputting a signal in response to a polarization component of the light; and signal analyzing means for receiving the signal and for determining the magnitude of the physical condition in accordance with the signal.

2. An apparatus as in claim 1 wherein:

the physical condition is a magnetic field; and the non-reciprocal birefringence effect is the Faraday effect.

3. An apparatus as in claim 1, wherein the detecting means comprises:

an analyzing polarizer for extracting a polarization component of the portion of the light; and a photodetector for detecting the polarization component and outputting the signal so that the signal has an amplitude that is a function of an intensity of the polarization component.

4. An apparatus as in claim 3, wherein the detecting means further comprises:

non-polarizing beam splitting means, disposed in a path of the portion of the light between the Fabry-Perot cavity and the analyzing polarizer, for picking off a fraction from the portion of the light; and a second photodetector for receiving the fraction and for outputting to the signal analyzing means a second signal in response to the fraction;

wherein the signal analyzing means determines the magnitude in accordance with the signal and the second signal.

5. An apparatus as in claim 4, wherein the signal analyzing means comprises:

a divider for receiving the signal and the second signal and for determining a quotient of amplitudes of the signal and the second signal; and means for determining the magnitude in accordance with the quotient.

6. An apparatus as in claim 3, wherein the light source means comprises:

a laser for emitting linearly polarized light;

an isolator for preventing back-reflected light from reaching the laser; and a half-wave plate disposed in a path of the linearly polarized light between the isolator and the Fabry-Perot cavity.

7. An apparatus as in claim 1, wherein:

the light source means comprises a first optical fiber for conveying the light to the Fabry-Perot cavity; and the detecting means comprises a second optical fiber for conveying the portion of the light from the Fabry-Perot cavity.

8. An apparatus as in claim 7, wherein:

the first optical fiber has an end facing the Fabry-Perot cavity;

the second optical fiber has an end facing the Fabry-Perot cavity;

the Fabry-Perot cavity comprises a first reflector disposed on the end of the first optical fiber and a second reflector disposed on the end of the second optical fiber; and the material is disposed between the first and second reflectors.

9. An apparatus as in claim 8, wherein:

the light has a wavelength $\lambda$; and the first and second reflectors are spaced apart by a distance $n\lambda/2$, where n is an integer.

10. An apparatus as in claim 8, wherein the Fabry-Perot cavity further comprises:

a first collimating lens disposed between the first reflector and the material; and a second collimating lens disposed between the second reflector and the material.

11. An apparatus for detecting a magnitude of a physical condition, the apparatus comprising:

a light source means for producing light having a polarization component;

a Fabry-Perot cavity having reflective end surfaces, said cavity for receiving the light therein and for reflecting light between said end surfaces;

a material disposed in the Fabry-Perot cavity, and material exhibiting a non-reciprocal birefringence effect in response to the physical condition for producing a sensible rotation of the polarization component of the light in response thereto;

said end surfaces being separated by about an integer number of one-half wavelengths of the light so that at least a portion of the light reflected between the reflective end surfaces within the Fabry-Perot cavity passes through the material a plurality of times for maximizing the rotation;

detecting means for receiving the rotation for outputting a signal in response to thereto; and signal analyzing means for receiving the signal and for determining the magnitude of the physical condition in accordance with the signal.

* * * * *